US012690132B2

(12) United States Patent
Khouri et al.

(10) Patent No.: US 12,690,132 B2
(45) Date of Patent: Jul. 21, 2026

(54) RELEASABLE SPACER, SOLID-STATE DRIVE ASSEMBLY, AND METHOD TO MANUFACTURE THE SAME

(71) Applicant: SK Hynix NAND Product Solutions Corp., Rancho Cordova, CA (US)

(72) Inventors: Gabriel Khouri, El Dorado Hills, CA (US); Jason Brand, Placerville, CA (US); John Hung, Vancouver (CA); Timothy Rothman, El Dorado, CA (US); Jaspal Singh Bhachu, Delta (CA); Jiaqi Deng, Shanghai (CN)

(73) Assignee: Solidigm Inc., Rancho Cordova, CA (US)

(*) Notice: Subject to any disclaimer, the term of this patent is extended or adjusted under 35 U.S.C. 154(b) by 54 days.

(21) Appl. No.: 18/573,521

(22) PCT Filed: Dec. 24, 2021

(86) PCT No.: PCT/CN2021/141215
§ 371 (c)(1),
(2) Date: Dec. 22, 2023

(87) PCT Pub. No.: WO2023/115539
PCT Pub. Date: Jun. 29, 2023

(65) Prior Publication Data
US 2024/0373556 A1      Nov. 7, 2024

(51) Int. Cl.
*H05K 1/14* (2006.01)
*H05K 3/36* (2006.01)

(52) U.S. Cl.
CPC ............. *H05K 1/144* (2013.01); *H05K 3/368* (2013.01); *H05K 2201/042* (2013.01); *H05K 2201/10159* (2013.01); *H05K 2201/10325* (2013.01)

(58) Field of Classification Search
CPC ............. H05K 1/14; H05K 1/141–144; H05K 2201/1042; H05K 2201/10159;
(Continued)

(56) References Cited

U.S. PATENT DOCUMENTS 5,031,073 A       7/1991  Chang
6,021,048 A  *   2/2000  Smith .................. H05K 7/1461
                                              361/764
(Continued)

FOREIGN PATENT DOCUMENTS

CN          209592372 U     11/2019
CN          112787121 A      5/2021

OTHER PUBLICATIONS

International Search Report and Written Opinion for International Application No. PCT/CN2021/141215, mailed Aug. 3, 2022, 8 pages.
(Continued)

*Primary Examiner* — Tuan T Dinh
(74) *Attorney, Agent, or Firm* — HG LAW LLP

(57) ABSTRACT

Systems, apparatuses, and methods may provide for technology for a releasable spacer associating a first printed circuit board with a second printed circuit board. The releasable spacer includes a first portion and a second portion. The first portion of the releasable spacer is attached to the first printed circuit board. The second portion of the releasable spacer is attached to the second printed circuit board. The releasable spacer is oriented and arranged to selectively couple and decouple the first printed circuit board from the second printed circuit board. The releasable spacer is oriented and arranged to permit airflow between the first printed circuit board and the second printed circuit board when selectively coupled.

15 Claims, 10 Drawing Sheets

(58) Field of Classification Search

CPC .. H05K 2201/10325; H05K 2201/2036; H01L 23/498; H01L 23/552

USPC ................ 361/770, 790, 792, 775–778, 803; 257/660–690

See application file for complete search history.

(56) References Cited

U.S. PATENT DOCUMENTS

| | | | | |
|---|---|---|---|---|
| 6,669,313 | B2* | 12/2003 | Liao | H05K 7/142 361/796 |
| 6,773,285 | B2* | 8/2004 | Bernat | H01R 13/6315 439/246 |
| 7,300,299 | B2* | 11/2007 | Wang | H05K 7/142 439/326 |
| 10,446,955 | B2* | 10/2019 | Hoyack | H01R 13/6582 |
| 11,025,008 | B2* | 6/2021 | Kim | H01R 13/052 |
| 2009/0045562 | A1* | 2/2009 | Reisel | F16F 9/54 267/249 |
| 2009/0149086 | A1* | 6/2009 | Dahms | H01R 24/50 439/835 |
| 2011/0199747 | A1* | 8/2011 | Ishii | H05K 3/368 361/784 |
| 2014/0148020 | A1* | 5/2014 | Manushi | H01R 12/52 439/66 |
| 2021/0143568 | A1 | 5/2021 | Zheng et al. | |

OTHER PUBLICATIONS

International Publication No. WO 2023/115539 A1, International Publication date Jun. 29, 2023, 39 pages.

* cited by examiner

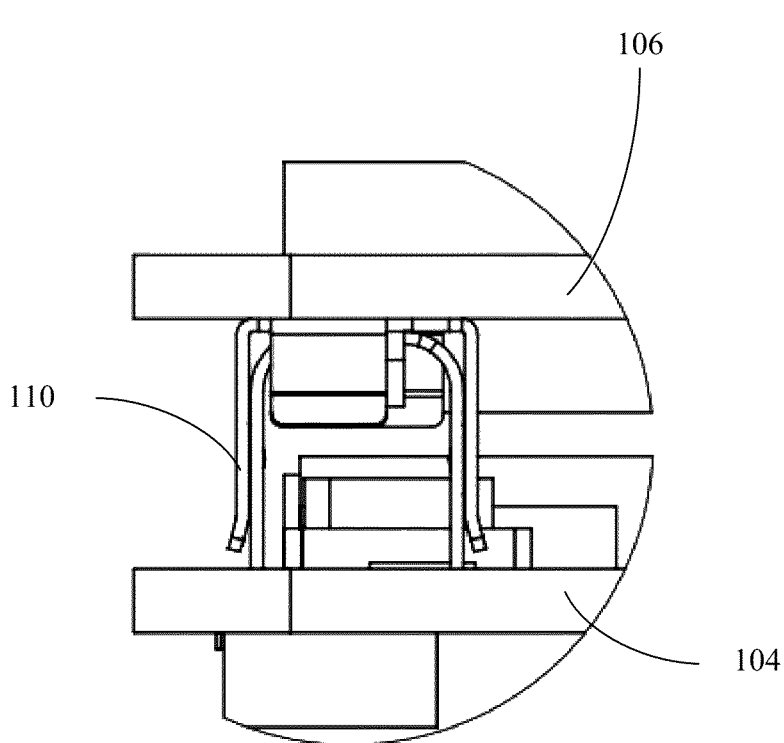
FIG. 5

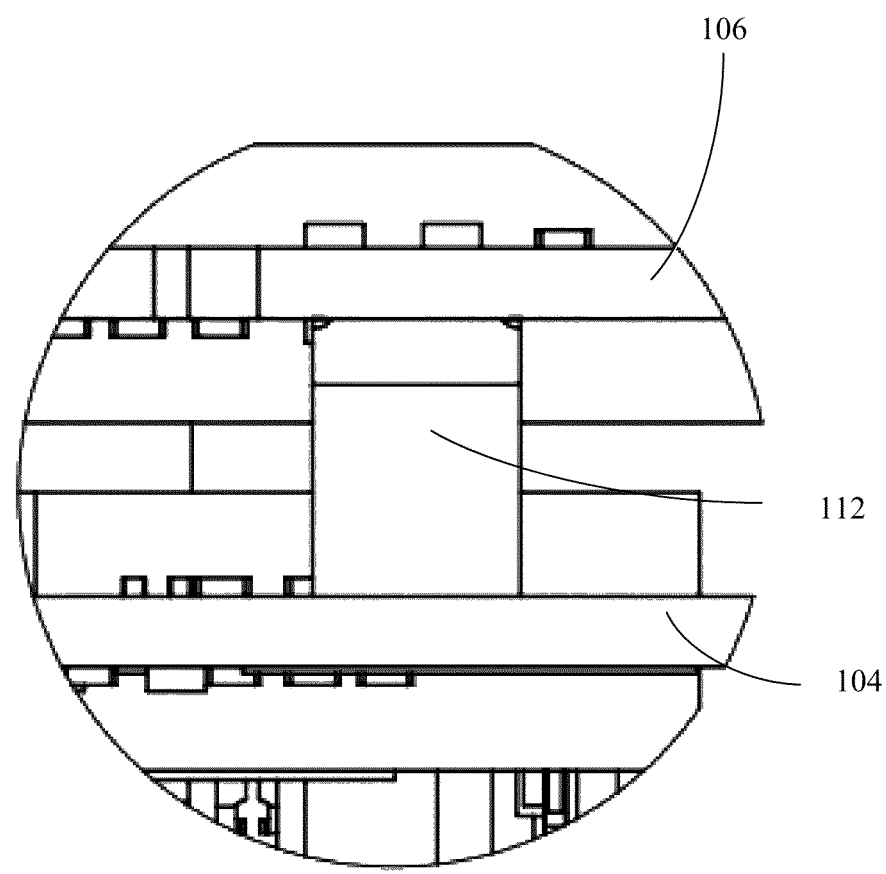
FIG. 6

810

811

812

900

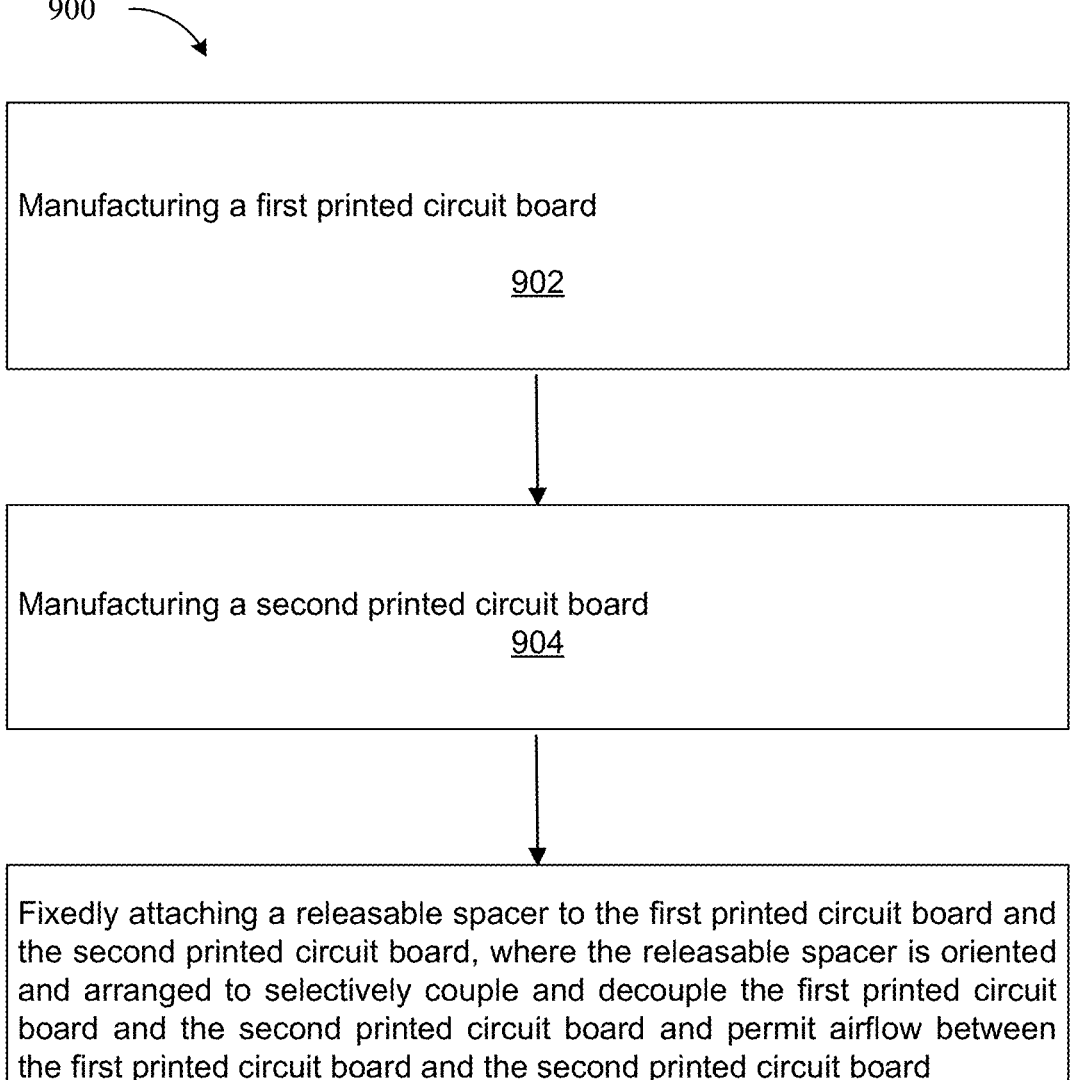

Manufacturing a first printed circuit board

902

Manufacturing a second printed circuit board
904

Fixedly attaching a releasable spacer to the first printed circuit board and the second printed circuit board, where the releasable spacer is oriented and arranged to selectively couple and decouple the first printed circuit board and the second printed circuit board and permit airflow between the first printed circuit board and the second printed circuit board

RELEASABLE SPACER, SOLID-STATE DRIVE ASSEMBLY, AND METHOD TO MANUFACTURE THE SAME

CROSS REFERENCE TO RELATED APPLICATIONS

The present application is a U.S. National Phase Patent Application, which claims the benefit of priority to International Patent Application No. PCT/CN2021/141215 filed on Dec. 24, 2021.

TECHNICAL FIELD

More Embodiments generally relate to printed circuit boards (PCBs). More particularly, embodiments relate to spacers utilized between multiple PCBs.

BACKGROUND

A solid state drive (SSD) is a data storage device that uses integrated circuit assemblies as memory to store data persistently. SSDs have no moving mechanical memory components, and this distinguishes SSDs from traditional electromechanical magnetic drives, such as magnetic hard disk drives (HDDs), which contain spinning disks and movable read/write heads. Compared to HDDs, SSDs are typically more resistant to physical shock, run silently, have lower access time, and less latency.

Many types of SSDs use NAND-based flash memory which comprises an electronic (solid-state) non-volatile computer storage medium that can be electrically erased and reprogrammed. SSDs may include a printed circuit board (PCB) with a controller chip and a plurality of memory chips positioned thereon.

Dual printed circuit board (PCB) SSDs have a delicate fold (like a hardbound book binding) connecting the pair of PCBs. Accordingly, a PCB-to-PCB distance may be maintained parallel and kept at a given spacing position during assembly and handling.

BRIEF DESCRIPTION OF THE DRAWINGS

The various advantages of the embodiments will become apparent to one skilled in the art by reading the following specification and appended claims, and by referencing the following drawings, in which:

FIG. 5 illustrates an example front view of an edge of a solid state drive assembly on the detail view A of FIG. 1 according to an embodiment;

FIG. 6 illustrates an example front view of an edge of a solid state drive assembly on the detail view B of FIG. 1 according to an embodiment;

FIG. 9 is a flowchart of an example method of forming a memory device according to an embodiment.

DESCRIPTION OF EMBODIMENTS

Figure 1:
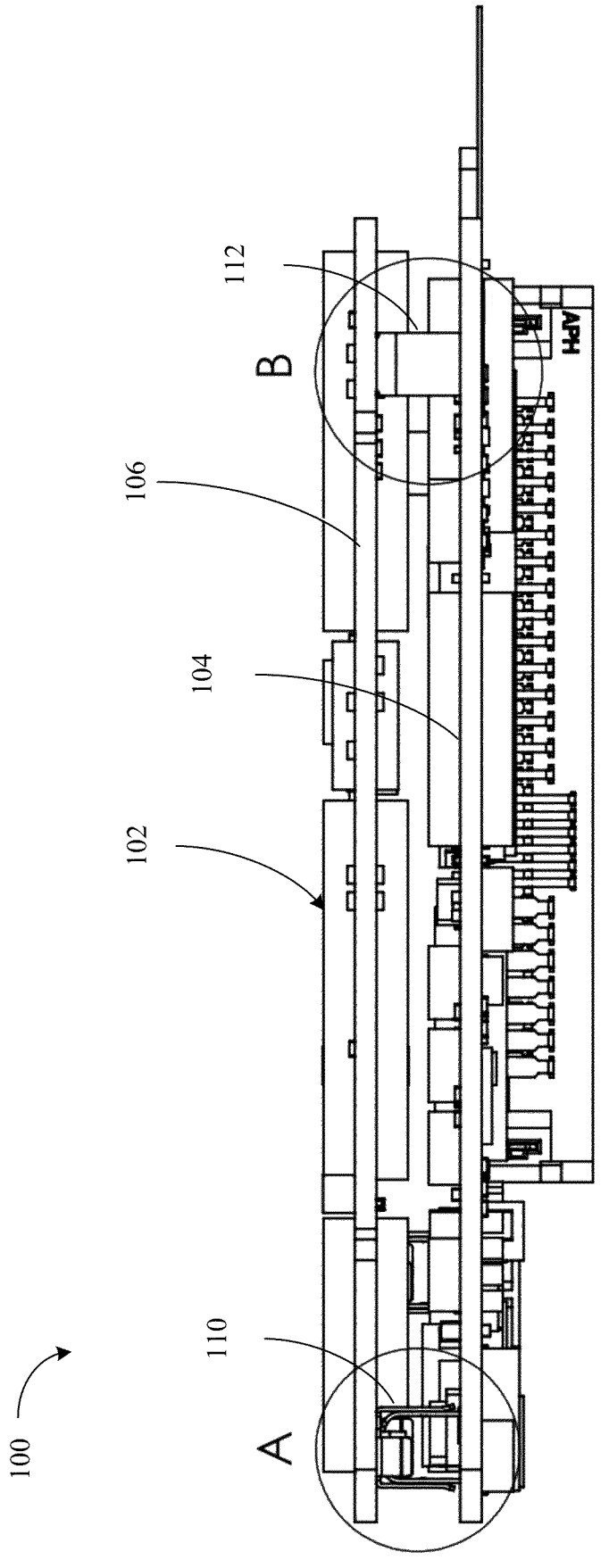
FIG. 1 is a front view of an example solid state drive assembly according to an embodiment.

As described above, dual printed circuit board (PCB) SSDs have a delicate fold (like a hardbound book binding) connecting the pair of PCBs. Accordingly, a PCB-to-PCB distance may be maintained parallel and kept at a given spacing position during assembly and handling. At times, PCBs may need to be unfolded, so it may be desirable to have the retention of the PCB-to-PCB given spacing position be able to release.

An existing solution consists of a plastic rim component enclosing the entire perimeter between the pair of PCBs. Such a plastic rim is difficult to include in the automated assembly process, so it is typically placed manually.

The plastic rim-type existing solution has several drawbacks. For example, such a plastic rim-type existing solution may disadvantageously: typically block airflow between the folded pair of PCBs, typically require manual placement during installation and subsequent handling that sometimes requires repositioning of the plastic spacer, typically only keep the two PCBs at constant distance but does not positively retain or lock the PCBs in a fixed position (e.g., there may be some splay in the XY plane and in the z-plane), and typically require a unique part for each product type of the same product family.

As will be descried in greater detail below, systems, apparatuses, and methods are described that may provide for technology for a releasable spacer associating a first printed circuit board with a second printed circuit board. The releasable spacer includes a first portion and a second portion. The first portion of the releasable spacer is attached to the first printed circuit board. The second portion of the releasable spacer is attached to the second printed circuit board. The releasable spacer is oriented and arranged to selectively couple and decouple the first printed circuit board from the second printed circuit board. The releasable spacer is oriented and arranged to permit airflow between the first printed circuit board and the second printed circuit board when coupled.

In some implementations, a releasable spacer is a two-part mating and standoff system which uses longer vertical features to align and fix the folded PCBs in the XY plane and in the Z plane. Additionally, or alternatively, short horizontal features aid in robotic assembly. Additionally, or alternatively, horizontal features provide a robust area for solder or adhesive to retain the releasable spacer in place with six degrees of Freedom fixation (e.g., in X, Y, Z, and Theta directions). Additionally, or alternatively, a separate standoff is utilized to keep a uniform distance between the pair of PCBs with a less complex assembly. The material of the releasable spacer can be electrically conductive or a dielectric depending on the requirements of a given application.

Such a releasable spacer associating a first printed circuit board with a second printed circuit board as described herein may have several advantages. In some implementations, the releasable spacer may advantageously: provide a tunable and controllable spring force for engagement (e.g., between joining parts, retention (holding), and/or disengagement), provide a reduced footprint as compared to a plastic rim-type existing solution, permit open airflow between the folded PCBs, permit automated placement (e.g., in surface-mount technology (SMT) processes) during assembly, permit all products of the same product family to use the same spacer design, and/or provide a reduced cost as compared to a plastic rim-type existing solution. Additionally, or alternatively, such a releasable spacer may advantageously: keep a constant distance between the pair of PCBs to prevent electronic components from colliding, releasably clasp the pair of PCBs together and enable the pair of PCBs to be opened repeatedly, ensure thermal performance by keeping components in compression against a heat spreader and/or a heat sink, provide electrical grounding between both boards, provide spring loaded tension to absorb shocks and/or vibrations, and/or hold the pair of PCBs rigidly through different steps of product assembly.

FIG. 1 is a front view of an example solid state drive assembly according to an embodiment. As illustrated, a memory device 100 is implementable as a solid state drive assembly 102, for example.

In some implementations, the memory device 100 includes a first printed circuit board 104 and a second printed circuit board 106. The first printed circuit board 104 includes one or more memory chips. Similarly, a second printed circuit board 106 including at least one memory chip. It will be appreciated that the techniques described herein are applicable to coupling two or more printed circuit boards; however, for simplicity, printed circuit board are primarily described with regard to a pair of printed circuit boards.

In some examples, the memory device 100 includes a releasable spacer 110. For example, such a releasable spacer 110 is fixedly attached to the first printed circuit board 104 and to the second printed circuit board 106. As will be described in greater detail below, the releasable spacer is oriented and arranged to selectively couple and decouple the first printed circuit board 104 from the second printed circuit board 106. Additionally, or alternatively, the releasable spacer 110 is oriented and arranged to permit airflow between the first printed circuit board 104 and the second printed circuit board 106 when selectively coupled.

Additionally, or alternatively, the solid state drive assembly 102 further includes a static standoff 112. Such a static standoff 112 is fixedly attached to the first printed circuit board 104, for example. The static standoff 112 is oriented and arranged to rest on the second printed circuit board 106 and to maintain a fixed distance between the first printed circuit board 104 and the second printed circuit board 106.

The memory device 100 may include non-volatile memory and/or volatile memory. For example, in some implementations, the solid state drive utilizes a multi-deck or multi-layer memory architecture, such as a three-dimensional crosspoint solid state drive, although other types of memory may be utilized.

Examples of multi-deck or multi-layer memory architectures include multi-deck crosspoint memory and 3D NAND memory. Different memory technologies have adopted different terminology. For example, a deck in a crosspoint memory device typically refers to a layer of memory cell stacks that can be individually addressed. In contrast, a 3D NAND memory device is typically said to include a NAND array that includes many layers, as opposed to decks. In 3D NAND, a deck may refer to a subset of layers of memory cells (e.g., two decks of X-layers to effectively provide a 2X-layer NAND device). The term "deck" will be used throughout this disclosure to describe a layer, a tier, or a similar portion of a three-dimensional memory.

Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

As will be described in greater detail below, systems, apparatuses and methods of some implementations herein provide for technology that provides the capability for improved data reliability of the paired PCBs by reducing SSD temperatures and/or by providing robust electrical grounding. This, in turn, can permit a larger temperature and performance margin and/or lower the total cost of ownership of a server system with reduce airflow.

Figure 2:
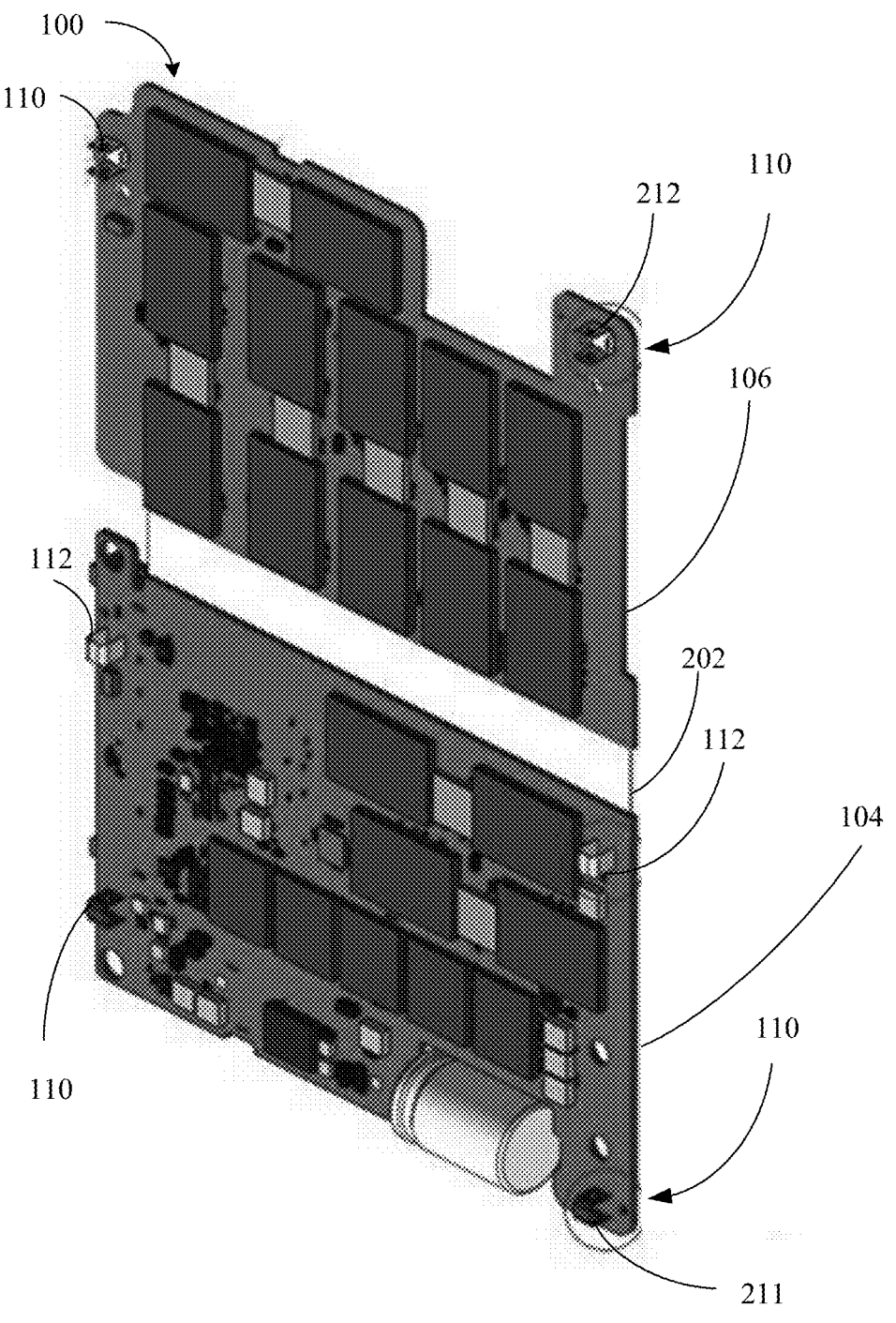
FIG. 2 is a perspective view of an example solid state drive assembly according to an embodiment.

FIG. 2 is a perspective view of an example solid state drive assembly 102 according to an embodiment. As illustrated, the solid state drive assembly 102 includes a connector binding 202, for example. Such a connector binding 202 is flexibly associated with a first edge of the first printed circuit board 104 and a second edge of the second printed circuit board 106. In operation, such a connector binding 202 acts like a book spine flexibly connecting two covers of a book together.

In the illustrated implementation, a plurality of releasable spacers 110 may be located at various locations on the first printed circuit board 104 and/or the second circuit board 106. As illustrated, the plurality of releasable spacers 110 each have a first portion 211 and a second portion 212, for example. Such a first portion 211 of the releasable spacer 110 is attachable to the first printed circuit board 104. Similarly, such a second portion 212 of the releasable spacer 110 is attachable to the second printed circuit board 106. As illustrated, the releasable spacer 110 is oriented and arranged to selectively decouple the first printed circuit board 104 from the second printed circuit board 106.

In the illustrated implementation, there may be a plurality of static standoffs 112. Such a plurality of static standoffs 112 may be located at various locations on the first printed circuit board 104. As illustrated, the plurality of static standoffs 112 are fixedly attached to the first printed circuit board 104, for example. Conversely, the plurality of static standoffs 112 are oriented and arranged to rest on the second printed circuit board 106 and to maintain a fixed distance between the first printed circuit board 104 and the second printed circuit board 106.

Additionally, or alternatively, a portion of the plurality of static standoffs 112 may be attached to the second printed circuit board 106.

Figure 3:
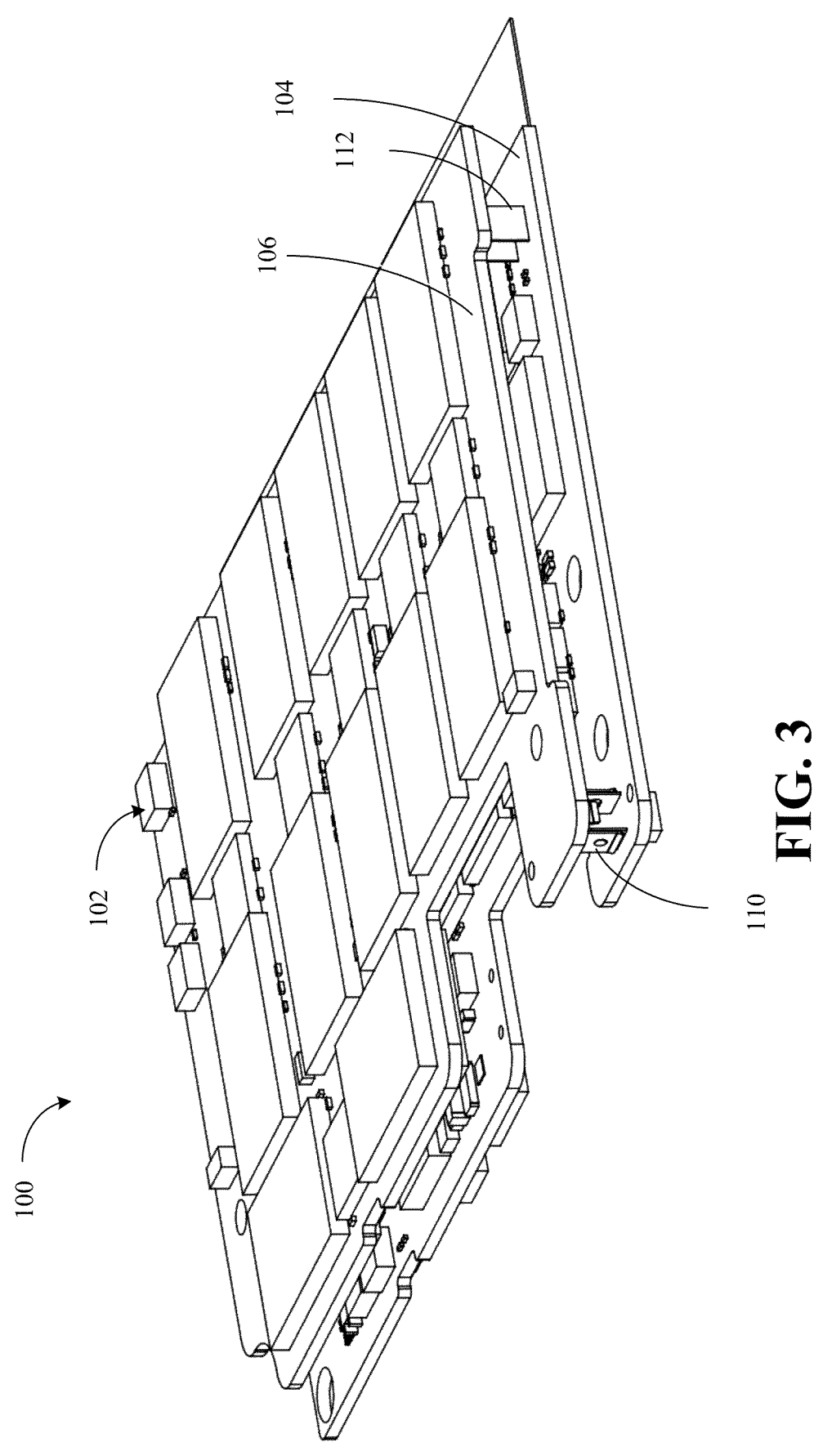
FIG. 3 is another a perspective view of an example solid state drive assembly according to an embodiment.

FIG. 3 is another a perspective view of an example solid state drive assembly 102 according to an embodiment. As illustrated, the releasable spacer 110 is oriented and arranged to selectively couple the first printed circuit board 104 to the second printed circuit board 106.

In some implementations, the releasable spacer 110 has a spring tension when the first printed circuit board 104 and the second printed circuit board 106 are selectively coupled together.

Additionally, or alternatively, in some implementations the releasable spacer 210 is composed of one or more electrically conductive materials. In such implementations, such a releasable spacer 210 composed of one or more electrically conductive materials is capable of providing electrical grounding between the first printed circuit board 104 and the second printed circuit board 106.

Figure 4:
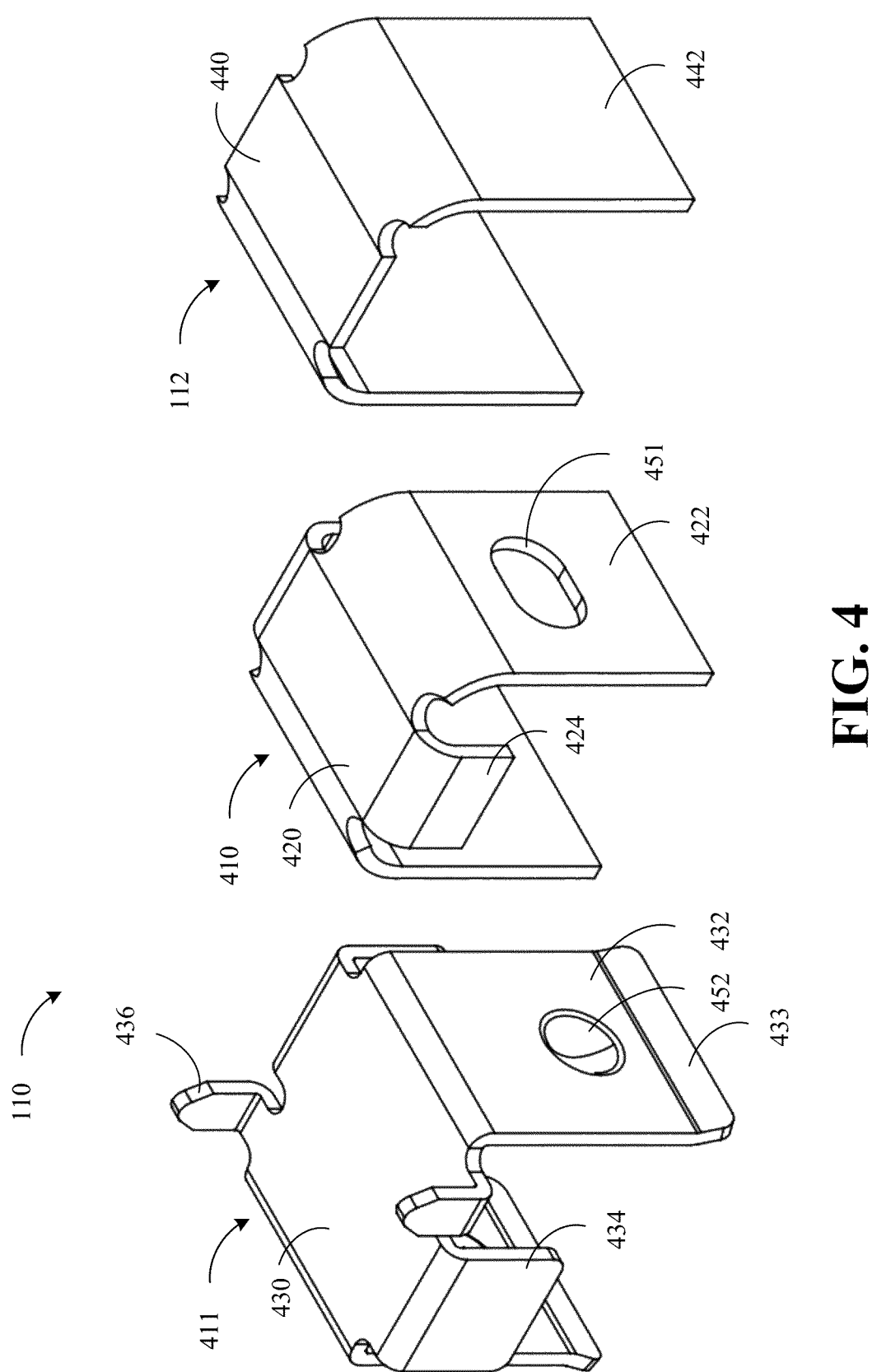
FIG. 4 illustrates an exploded diagram of an example releasable spacer according to an embodiment.

FIG. 4 illustrates an exploded diagram of an example releasable spacer 110 according to an embodiment. As illustrated, the releasable spacer 110 further includes a spacer retainer 410 and a spacer clip 411, for example. Such a spacer retainer 410 is fixedly attached to the first printed circuit board (e.g., See, the first printed circuit board 104 of FIG. 1). Such a spacer clip fixedly attached to the second printed circuit board (e.g., See, the second printed circuit board 106 of FIG. 1).

In some examples, the spacer retainer 410 includes a main body cap 420, a pair of legs 422, and/or a pair of arms 424. Such a main body cap 420 is positioned parallel to the first printed circuit board (e.g., See, the first printed circuit board 104 of FIG. 1). Such a pair of legs 422 are in parallel spaced alignment with one another and extend perpendicular to the main body cap 420. The pair of legs 422 are fixedly attached to the first printed circuit board (e.g., See, the first printed circuit board 104 of FIG. 1). Such a pair of arms 424 are in parallel spaced alignment with one another and extend perpendicular to the main body cap 420. The pair of arms 424 terminate prior to contacting the first printed circuit board (e.g., See, the first printed circuit board 104 of FIG. 1).

In some implementations, the spacer clip 411 includes a main body crown 430, a pair of guide legs 432, a pair of guide arms 434, and/or two or more feet 436. Such a main body crown 430 is positioned parallel to the second printed circuit board (e.g., See, the second printed circuit board 106 of FIG. 1). Such a pair of guide legs 432 are in parallel spaced alignment with one another and extend perpendicular to the main body crown 430. In some examples, the pair of guide legs 432 each include a lead-in edge 433. Such a lead-in edge 433 has a slanted alignment with respect to the perpendicular orientation of the pair of guide legs 432 to the main body crown 432. For example, the lead-in edge 433 is oriented and arranged to guide selective coupling and decoupling of the spacer clip 411 to the spacer retainer 410.

In some examples, such a pair of guide arms 434 are in parallel spaced alignment with one another and extend perpendicular to the main body crown 430, for example. In some implementations, the pair of guide arms each include a lead-in lip (e.g., not illustrated here, but having a similar design as the lead-in edge 433) that has a slanted alignment with respect to the perpendicular orientation of the one or more guide arms 434 to the main body crown 430, where the lead-in lip is oriented and arranged to guide selective coupling and decoupling of the spacer clip 411 to the spacer retainer 410.

In some implementations, the two or more feet 436 extend perpendicular to the main body crown 430 in a direction opposite from the pair of guide legs 432. For example, the two or more feet are fixedly attached to the second printed circuit board (e.g., See, the second printed circuit board 106 of FIG. 1).

As illustrated, the releasable spacer 110 includes a mateable stud and hollow fastener having a first portion of the mateable stud and hollow fastener 451 and a second potion of the mateable stud and hollow fastener 452. For example, such a first portion of the mateable stud and hollow fastener 451 is located on the spacer retainer 410. Similarly, such a second portion of the mateable stud and hollow fastener 452 is located on the spacer clip 411. It will be appreciated that the first portion of the mateable stud and hollow fastener 451 and the second portion of the mateable stud and hollow fastener 452 exchange their respective association with the spacer retainer 410 and the spacer clip 411.

In the illustrated implementation, the static standoff 112 includes a main body roof 440 and a pair of supports 442. Such a main body roof 440 is positioned parallel to the second printed circuit board (e.g., See, the second printed circuit board 106 of FIG. 1). Such a main body roof 440 is oriented and arranged to rest on the second printed circuit board (e.g., See, the second printed circuit board 106 of FIG. 1). In some implementations the main body roof 440 is planar and rectangular in shape. Such a pair of supports 442 are in parallel spaced alignment to one another and extend perpendicular to the main body roof 440. For example, the pair of supports 442 are fixedly attached to the first printed circuit board (e.g., See, the first printed circuit board 104 of FIG. 1).

FIG. 5 illustrates an example front view of an edge of a solid state drive assembly 102 on the detail view A of FIG. 1 according to an embodiment. As illustrated, the releasable spacer 110 is fixedly attached to the first printed circuit board 104 and to the second printed circuit board 106. The releasable spacer is oriented and arranged to selectively couple and decouple the first printed circuit board 104 from the second printed circuit board 106.

FIG. 6 illustrates an example front view of an edge of a solid state drive assembly 102 on the detail view B of FIG. 1 according to an embodiment. As illustrated, the static standoff 112 is fixedly attached to the first printed circuit board 104, for example. The static standoff 112 is oriented and arranged to rest on the second printed circuit board 106 and to maintain a fixed distance between the first printed circuit board 104 and the second printed circuit board 106.

Figure 7:
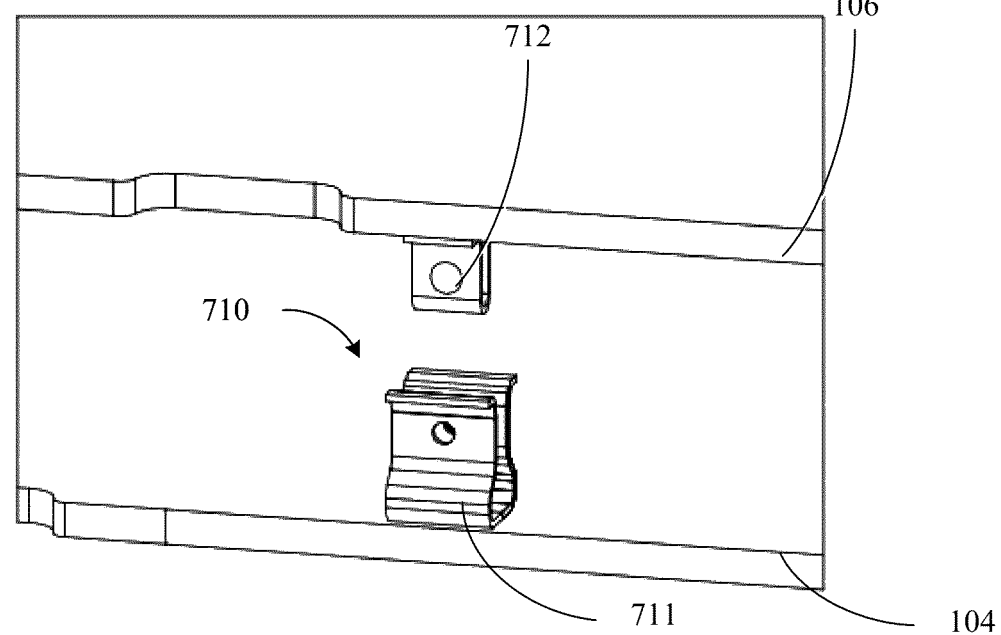
FIG. 7 illustrates an exploded diagram of another example releasable spacer according to an embodiment.

FIG. 7 illustrates an exploded diagram of another example releasable spacer 710 according to an embodiment. As illustrated, such a releasable spacer 710 is implementable as mateable stud and hollow fastener. For example, such a releasable spacer 710 includes a first portion of the mateable stud and hollow fastener 711 and a second portion of the mateable stud and hollow fastener 712. In the illustrated implementation, the first portion of the mateable stud and hollow fastener 711 is attached to the first printed circuit board 104 and the second portion of the mateable stud and hollow fastener 712 is attached to the second printed circuit board 106.

Figure 8:
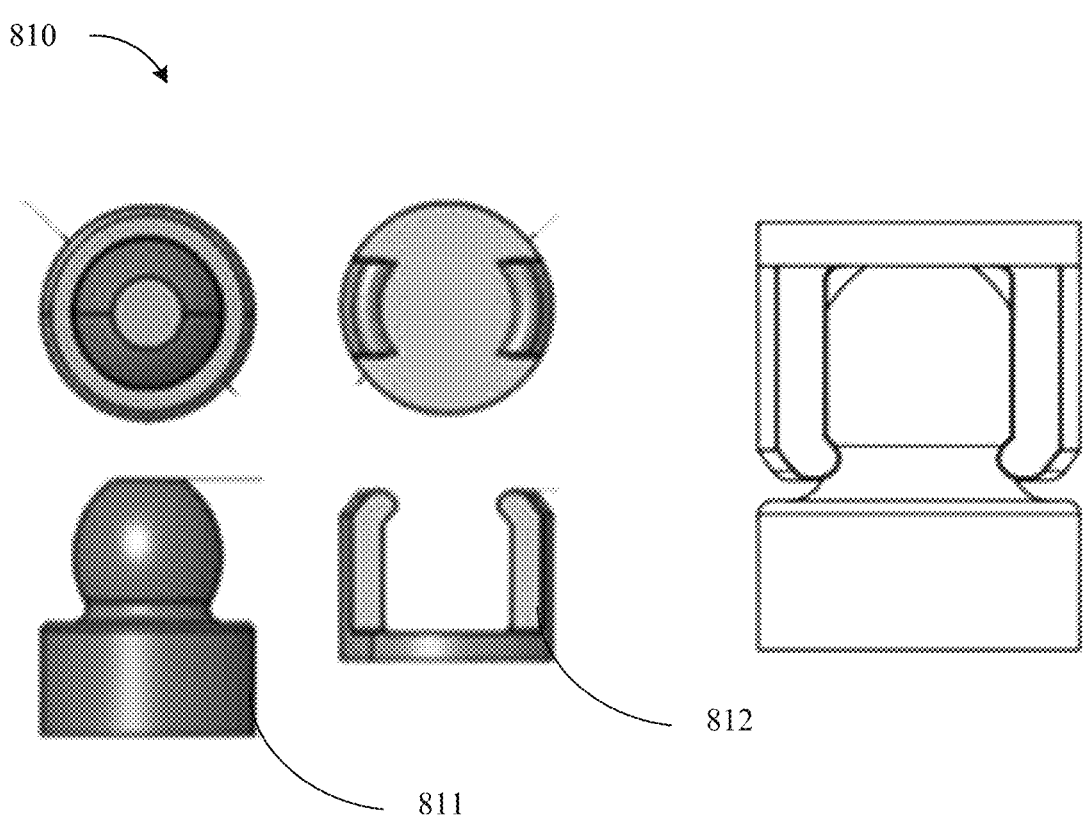
FIG. 8 illustrates an exploded diagram of a further example releasable spacer according to an embodiment.

FIG. 8 illustrates an exploded diagram of a further example releasable spacer 810 according to an embodiment. As illustrated, such a releasable spacer 810 is implementable as a mateable ball and socket fastener. For example, such a releasable spacer 810 includes a first portion of the mateable ball and socket fastener 811 and a second portion of the mateable ball and socket fastener 812. In the illustrated implementation, the first portion of the mateable ball and socket fastener 811 is attached to the first printed circuit board (e.g., See, the first printed circuit board 104 of FIG. 1) and the second portion of the mateable ball and socket fastener 812 is attached to the second printed circuit board (e.g., See, the second printed circuit board 106 of FIG. 1).

FIG. 9 is a flowchart of an example method 900 of manufacturing a solid state drive assembly according to an embodiment. The method 900 may generally be implemented to form a memory device, such as, for example, the memory device 100 (e.g., see FIGS. 1-3) having a pair of PCBs selectively coupled via a releasable spacer (e.g., see FIGS. 1-3), already discussed.

Illustrated processing block 902 provides for provides for manufacturing a first printed circuit board. For example, the first printed circuit board includes one or more memory chips.

Illustrated processing block 904 provides for manufacturing a second printed circuit board. For example, the second printed circuit board includes at least one memory chip.

Illustrated processing block 906 provides for fixedly attaching a releasable spacer to the first printed circuit board and to the second printed circuit board. For example, the releasable spacer is oriented and arranged to selectively couple and decouple the first printed circuit board from the second printed circuit board.

In some examples, the releasable spacer is oriented and arranged to permit airflow between the first printed circuit board and the second printed circuit board when selectively coupled.

Additional details regarding the various implementations of the method 900 are discussed below with regard to FIG. 10.

Figure 10:
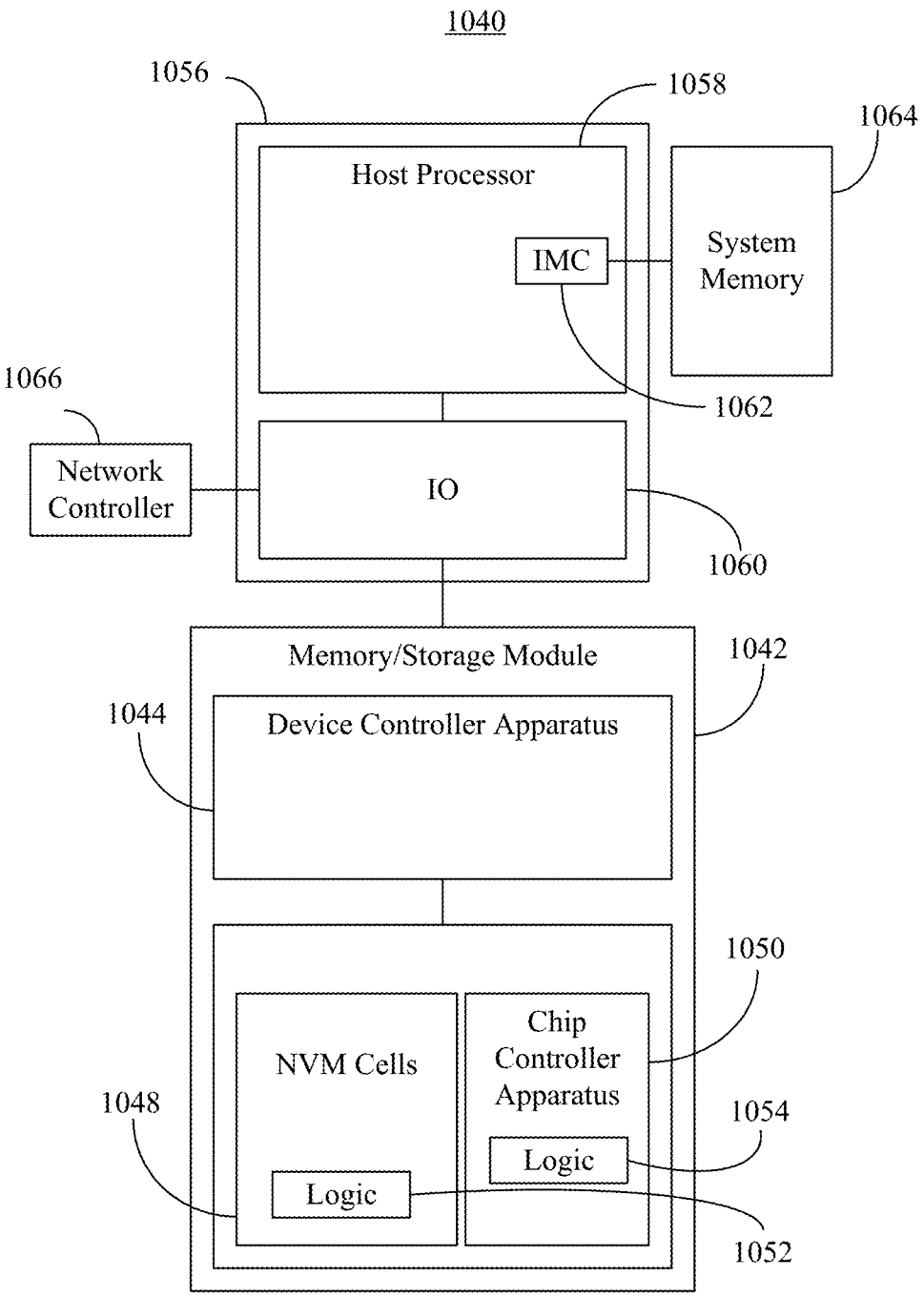
FIG. 10 is a block diagram of an example of a performance-enhanced computing system according to an embodiment.

Turning now to FIG. 10, a performance-enhanced computing system 1040 is shown. In the illustrated example, a solid state drive (SSD) 1042 includes a device controller apparatus 1044 that is coupled to a NAND 1046. The illustrated NAND 1046 includes a memory device 1048 having a set of multi-level NVM cells and logic 1052 (e.g., transistor array and other integrated circuit/IC components coupled to one or more substrates containing silicon, sapphire and/or gallium arsenide), and a chip controller apparatus 1050 that includes logic 1054. The logic 1054 may include one or more of configurable or fixed-functionality hardware.

The illustrated system 1040 also includes a system on chip (SoC) 1056 having a host processor 1058 (e.g., central processing unit/CPU) and an input/output (I/O) module 1060. The host processor 1058 may include an integrated memory controller 1062 (IMC) that communicates with system memory 1064 (e.g., RAM dual inline memory modules/DIMMs). The illustrated IO module 1060 is coupled to the SSD 1042 as well as other system components such as a network controller 1066.

In some embodiments, the solid state drive (SSD) 1042 implements one or more aspects of the memory device 100 (e.g., see FIGS. 1-3) already discussed. For example, the solid state drive (SSD) 1042 is implementable as a pair of PCBs selectively coupled via a releasable spacer (e.g., see FIGS. 1-3) already discussed.

ADDITIONAL NOTES AND EXAMPLES

Example 1 includes a solid state drive assembly comprising: a first printed circuit board including one or more memory chips; a second printed circuit board including at least one memory chip; and a releasable spacer fixedly attached to the first printed circuit board and to the second printed circuit board, the releasable spacer oriented and arranged to selectively couple and decouple the first printed circuit board from the second printed circuit board, and wherein the releasable spacer is oriented and arranged to permit airflow between the first printed circuit board and the second printed circuit board when selectively coupled.

Example 2 includes the solid state drive assembly of Example 1, wherein the releasable spacer has a spring tension when the first printed circuit board and the second printed circuit board are selectively coupled together.

Example 3 includes the solid state drive assembly of Example 1, wherein the releasable spacer is composed of one or more electrically conductive materials.

Example 4 includes the solid state drive assembly of Example 1, wherein the releasable spacer further comprises: a mateable stud and hollow fastener, wherein a first portion of the mateable stud and hollow fastener is attached to the first printed circuit board and a second portion of the mateable stud and hollow fastener is attached to the second printed circuit board.

Example 5 includes the solid state drive assembly of Example 1, wherein the releasable spacer further comprises: a mateable ball and socket fastener, wherein a first portion of the mateable ball and socket fastener is attached to the first printed circuit board and a second portion of the mateable ball and socket fastener is attached to the second printed circuit board.

Example 6 includes the solid state drive assembly of Example 1, the solid state drive assembly further comprising: a connector binding flexibly associated with a first edge of the first printed circuit board and a second edge of the second printed circuit board;

Example 7 includes the solid state drive assembly of Example 1, the solid state drive assembly further comprising: a static standoff fixedly attached to the first printed circuit board, the static standoff oriented and arranged to rest on the second printed circuit board and to maintain a fixed distance between the first and second printed circuit boards.

Example 8 includes the solid state drive assembly of Example 7, wherein the static standoff further comprises: a main body roof positioned parallel to the second printed circuit board, wherein the main body roof is oriented and arranged to rest on the second printed circuit board and, wherein the main body roof is rectangular in shape; a pair of supports in parallel spaced alignment and extending perpendicular to the main body roof, wherein the pair of supports are fixedly attached to the first printed circuit board.

Example 9 includes the solid state drive assembly of Example 8, wherein the releasable spacer further comprises: a spacer retainer fixedly attached to the first printed circuit board, the spacer retainer comprising: a main body cap positioned parallel to the first printed circuit board, a pair of legs in parallel spaced alignment and extending perpendicular to the main body cap, wherein the pair of legs are fixedly attached to the first printed circuit board, a pair of arms in parallel spaced alignment and extending perpendicular to the main body cap, wherein the pair of arms terminate prior to contacting the first printed circuit board, a spacer clip fixedly attached to the second printed circuit board, the spacer clip comprising: a main body crown positioned parallel to the second printed circuit board, a pair of guide legs in parallel spaced alignment and extending perpendicular to the main body crown, the pair of guide legs each comprising: a lead-in edge that has a slanted alignment with respect to the perpendicular orientation of the pair of guide legs to the main body crown, wherein the lead-in edge is oriented and arranged to guide selective coupling and decoupling of the spacer clip to the spacer retainer, a pair of guide arms in parallel spaced alignment and extending perpendicular to the main body crown, the pair of guide arms each comprising: a lead-in lip that has a slanted alignment with respect to the perpendicular orientation of the one or more guide arms to the main body crown, wherein the lead-in lip is oriented and arranged to guide selective coupling and decoupling of the spacer clip to the spacer retainer, and two or more feet extending perpendicular to the main body crown in a direction opposite from the pair of guide legs, wherein the two or more feet are fixedly attached to the second printed circuit board; and a mateable stud and hollow fastener, wherein a first portion of the mateable stud and hollow fastener is located on the spacer retainer and a second portion of the mateable stud and hollow fastener is located on the spacer clip.

Example 10 includes a releasable spacer comprising: a first portion of a releasable spacer, wherein the first portion of the releasable spacer is attachable to a first printed circuit board; and a second portion of the releasable spacer, wherein the second portion of the releasable spacer is attachable to a second printed circuit board, wherein the releasable spacer is fixedly attachable to the first printed circuit board and to the second printed circuit board, the releasable spacer oriented and arranged to selectively couple and decouple the first printed circuit board from the second printed circuit board, and wherein the releasable spacer is oriented and arranged to permit airflow between the first printed circuit board and the second printed circuit board when selectively coupled.

Example 11 includes the releasable spacer of Example 10, wherein the releasable spacer has a spring tension when the first printed circuit board and the second printed circuit board are selectively coupled together.

Example 12 includes the releasable spacer of Example 10, wherein the releasable spacer is composed of one or more electrically conductive materials.

Example 13 includes the releasable spacer of Example 10, further comprising: a static standoff fixedly attachable to the first printed circuit board, the static standoff oriented and arranged to rest on the second printed circuit board and to maintain a fixed distance between the first and second printed circuit boards, wherein the static standoff further comprises: a main body roof positioned parallel to the second printed circuit board, wherein the main body roof is oriented and arranged to rest on the second printed circuit board and, wherein the main body roof is rectangular in shape; a pair of supports in parallel spaced alignment and extending perpendicular to the main body roof, wherein the pair of supports are fixedly attachable to the first printed circuit board.

Example 14 includes the releasable spacer of Example 13, wherein the releasable spacer further comprises: a spacer retainer fixedly attachable to the first printed circuit board, the spacer retainer comprising: a main body cap positioned parallel to the first printed circuit board, a pair of legs in parallel spaced alignment and extending perpendicular to the main body cap, wherein the pair of legs are fixedly attachable to the first printed circuit board, a pair of arms in parallel spaced alignment and extending perpendicular to the main body cap, wherein the pair of arms terminate prior to contacting the first printed circuit board, a spacer clip fixedly attachable to the second printed circuit board, the spacer clip comprising: a main body crown positioned parallel to the second printed circuit board, a pair of guide legs in parallel spaced alignment and extending perpendicular to the main body crown, the pair of guide legs each comprising: a lead-in edge that has a slanted alignment with respect to the perpendicular orientation of the pair of guide legs to the main body crown, wherein the lead-in edge is oriented and arranged to guide selective coupling and decoupling of the spacer clip to the spacer retainer, a pair of guide arms in parallel spaced alignment and extending perpendicular to the main body crown, the pair of guide arms each comprising: a lead-in lip that has a slanted alignment with respect to the perpendicular orientation of the one or more guide arms to the main body crown, wherein the lead-in lip is oriented and arranged to guide selective coupling and decoupling of the spacer clip to the spacer retainer, and two or more feet extending perpendicular to the main body crown in a direction opposite from the pair of guide legs, wherein the two or more feet are fixedly attachable to the second printed circuit board; and wherein a first portion of a fastener is located on the spacer retainer and a second portion of the fastener is located on the spacer clip to selectively couple and decouple the first printed circuit board from the second printed circuit board.

Example 15 includes the method of manufacturing a solid state drive assembly comprising: manufacturing a first printed circuit board including one or more memory chips; manufacturing a second printed circuit board including at least one memory chip; and fixedly attaching a releasable spacer to the first printed circuit board and to the second printed circuit board, the releasable spacer oriented and arranged to selectively couple and decouple the first printed circuit board from the second printed circuit board, and wherein the releasable spacer is oriented and arranged to permit airflow between the first printed circuit board and the second printed circuit board when coupled.

Example 16 includes the method of manufacturing the solid state drive assembly of Example 15, wherein the releasable spacer has a spring tension when the first printed circuit board and the second printed circuit board are selectively coupled together.

Example 17 includes the method of manufacturing the solid state drive assembly of Example 15, wherein the releasable spacer is composed of one or more electrically conductive materials.

Example 18 includes the method of manufacturing the solid state drive assembly of Example 15, wherein the releasable spacer further comprises: a first portion of the releasable spacer attached to the first printed circuit board and a second portion of the releasable spacer attached to the second printed circuit board.

Example 19 includes the method of manufacturing the solid state drive assembly of Example 15, wherein the releasable spacer further comprises: a mateable ball and socket fastener, wherein a first portion of the mateable ball and socket fastener is attached to the first printed circuit board and a second portion of the mateable ball and socket fastener is attached to the second printed circuit board.

Example 20 includes the method of manufacturing the solid state drive assembly of Example 15, the solid state drive assembly further comprising: a static standoff fixedly attached to the first printed circuit board, the static standoff oriented and arranged to rest on the second printed circuit board and to maintain a fixed distance between the first and second printed circuit boards.

Example 21 includes an apparatus comprising means for performing the method of any one of Examples 15 to 20.

Example 22 includes a machine-readable storage comprising machine-readable instructions, which when executed, implement a method or realize an apparatus as claimed in any preceding Example.

Technology described herein therefore provides the capability for improved data reliability of the paired PCBs by reducing SSD temperatures and/or by providing robust electrical grounding. This, in turn, can permit a larger temperature and performance margin and/or lower the total cost of ownership of a server system with reduce airflow.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical, or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A solid state drive assembly comprising:
a first printed circuit board including one or more memory chips;
a second printed circuit board including at least one memory chip; and
a releasable spacer fixedly attached to the first printed circuit board and to the second printed circuit board, the releasable spacer oriented and arranged to selectively couple and decouple the first printed circuit board from the second printed circuit board, and wherein the releasable spacer is oriented and arranged to permit airflow between the first printed circuit board and the second printed circuit board when selectively coupled, and wherein the releasable spacer further comprises:
a spacer retainer fixedly attached to the first printed circuit board, the spacer retainer comprising:
a main body cap positioned parallel to the first printed circuit board,
a pair of legs in parallel spaced alignment and extending perpendicular to the main body cap, wherein the pair of legs are fixedly attached to the first printed circuit board, and
a pair of arms in parallel spaced alignment and extending perpendicular to the main body cap, wherein the pair of arms terminate prior to contacting the first printed circuit board,
a spacer clip fixedly attached to the second printed circuit board, the spacer clip comprising:
a main body crown positioned parallel to the second printed circuit board, and a pair of guide legs in parallel spaced alignment and extending perpendicular to the main body crown, the pair of guide legs each comprising:

a lead-in edge that has a slanted alignment with respect to the perpendicular orientation of the pair of guide legs to the main body crown, wherein the lead-in edge is oriented and arranged to guide selective coupling and decoupling of the spacer clip to the spacer retainer, and a pair of guide arms in parallel spaced alignment and extending perpendicular to the main body crown, the pair of guide arms each comprising:

a lead-in lip that has a slanted alignment with respect to the perpendicular orientation of the one or more guide arms to the main body crown, wherein the lead-in lip is oriented and arranged to guide selective coupling and decoupling of the spacer clip to the spacer retainer, and two or more feet extending perpendicular to the main body crown in a direction opposite from the pair of guide legs, wherein the two or more feet are fixedly attached to the second printed circuit board, and a mateable stud and hollow fastener, wherein a first portion of the mateable stud and hollow fastener is located on the spacer retainer and a second portion of the mateable stud and hollow fastener is located on the spacer clip.

2. The solid state drive assembly of claim 1, wherein the releasable spacer has a spring tension when the first printed circuit board and the second printed circuit board are selectively coupled together.

3. The solid state drive assembly of claim 1, wherein the releasable spacer is composed of one or more electrically conductive materials.

4. The solid state drive assembly of claim 1, wherein the solid state drive assembly further comprises:

a connector binding flexibly associated with a first edge of the first printed circuit board and a second edge of the second printed circuit board.

5. The solid state drive assembly of claim 1, wherein the solid state drive assembly further comprises:

a static standoff fixedly attached to the first printed circuit board, the static standoff oriented and arranged to rest on the second printed circuit board and to maintain a fixed distance between the first and second printed circuit boards.

6. The solid state drive assembly of claim 5, wherein the static standoff further comprises:

a main body roof positioned parallel to the second printed circuit board, wherein the main body roof is oriented and arranged to rest on the second printed circuit board and, wherein the main body roof is rectangular in shape;

a pair of supports in parallel spaced alignment and extending perpendicular to the main body roof, wherein the pair of supports are fixedly attached to the first printed circuit board.

7. A releasable spacer comprising:

a first portion of a releasable spacer, wherein the first portion of the releasable spacer is attachable to a first printed circuit board;

a second portion of the releasable spacer, wherein the second portion of the releasable spacer is attachable to a second printed circuit board, wherein the releasable spacer is fixedly attachable to the first printed circuit board and to the second printed circuit board, the releasable spacer oriented and arranged to selectively couple and decouple the first printed circuit board from the second printed circuit board, and wherein the releasable spacer is oriented and arranged to permit airflow between the first printed circuit board and the second printed circuit board when selectively coupled;

a spacer retainer fixedly attachable to the first printed circuit board, the spacer retainer comprising:

a main body cap positioned parallel to the first printed circuit board, a pair of legs in parallel spaced alignment and extending perpendicular to the main body cap, wherein the pair of legs are fixedly attachable to the first printed circuit board, and a pair of arms in parallel spaced alignment and extending perpendicular to the main body cap, wherein the pair of arms terminate prior to contacting the first printed circuit board;

a spacer clip fixedly attachable to the second printed circuit board, the spacer clip comprising:

a main body crown positioned parallel to the second printed circuit board, a pair of guide legs in parallel spaced alignment and extending perpendicular to the main body crown, the pair of guide legs each comprising:

a lead-in edge that has a slanted alignment with respect to the perpendicular orientation of the pair of guide legs to the main body crown, wherein the lead-in edge is oriented and arranged to guide selective coupling and decoupling of the spacer clip to the spacer retainer, and a pair of guide arms in parallel spaced alignment and extending perpendicular to the main body crown, the pair of guide arms each comprising:

a lead-in lip that has a slanted alignment with respect to the perpendicular orientation of the one or more guide arms to the main body crown, wherein the lead-in lip is oriented and arranged to guide selective coupling and decoupling of the spacer clip to the spacer retainer, and two or more feet extending perpendicular to the main body crown in a direction opposite from the pair of guide legs, wherein the two or more feet are fixedly attachable to the second printed circuit board; and wherein a first portion of a fastener is located on the spacer retainer and a second portion of the fastener is located on the spacer clip to selectively couple and decouple the first printed circuit board from the second printed circuit board.

8. The releasable spacer of claim 7, wherein the releasable spacer has a spring tension when the first printed circuit board and the second printed circuit board are selectively coupled together.

9. The releasable spacer of claim 7, wherein the releasable spacer is composed of one or more electrically conductive materials.

10. The releasable spacer of claim 7, further comprising:

a static standoff fixedly attachable to the first printed circuit board, the static standoff oriented and arranged to rest on the second printed circuit board and to maintain a fixed distance between the first and second printed circuit boards, wherein the static standoff further comprises:

15
16 a main body roof positioned parallel to the second printed circuit board, wherein the main body roof is oriented and arranged to rest on the second printed circuit board and, wherein the main body roof is rectangular in shape;

a pair of supports in parallel spaced alignment and extending perpendicular to the main body roof, wherein the pair of supports are fixedly attachable to the first printed circuit board.

11. A method of manufacturing a solid state drive assembly comprising:

manufacturing a first printed circuit board including one or more memory chips;

manufacturing a second printed circuit board including at least one memory chip; and fixedly attaching a releasable spacer to the first printed circuit board and to the second printed circuit board, the releasable spacer oriented and arranged to selectively couple and decouple the first printed circuit board from the second printed circuit board, and wherein the releasable spacer is oriented and arranged to permit airflow between the first printed circuit board and the second printed circuit board when coupled, and wherein the releasable spacer further comprises:

a spacer retainer fixedly attached to the first printed circuit board, the spacer retainer comprising:

a main body cap positioned parallel to the first printed circuit board, a pair of legs in parallel spaced alignment and extending perpendicular to the main body cap, wherein the pair of legs are fixedly attached to the first printed circuit board, and a pair of arms in parallel spaced alignment and extending perpendicular to the main body cap, wherein the pair of arms terminate prior to contacting the first printed circuit board, a spacer clip fixedly attached to the second printed circuit board, the spacer clip comprising:

a main body crown positioned parallel to the second printed circuit board, and a pair of guide legs in parallel spaced alignment and extending perpendicular to the main body crown, the pair of guide legs each comprising:

a lead-in edge that has a slanted alignment with respect to the perpendicular orientation of the pair of guide legs to the main body crown, wherein the lead-in edge is oriented and arranged to guide selective coupling and decoupling of the spacer clip to the spacer retainer, and a pair of guide arms in parallel spaced alignment and extending perpendicular to the main body crown, the pair of guide arms each comprising:

a lead-in lip that has a slanted alignment with respect to the perpendicular orientation of the one or more guide arms to the main body crown, wherein the lead-in lip is oriented and arranged to guide selective coupling and decoupling of the spacer clip to the spacer retainer, and two or more feet extending perpendicular to the main body crown in a direction opposite from the pair of guide legs, wherein the two or more feet are fixedly attached to the second printed circuit board, and a mateable stud and hollow fastener, wherein a first portion of the mateable stud and hollow fastener is located on the spacer retainer and a second portion of the mateable stud and hollow fastener is located on the spacer clip.

12. The method of manufacturing the solid state drive assembly of claim 11, wherein the releasable spacer has a spring tension when the first printed circuit board and the second printed circuit board are selectively coupled together.

13. The method of manufacturing the solid state drive assembly of claim 11, wherein the releasable spacer is composed of one or more electrically conductive materials.

14. The method of manufacturing the solid state drive assembly of claim 11, wherein the releasable spacer further comprises:

a first portion of the releasable spacer attached to the first printed circuit board and a second portion of the releasable spacer attached to the second printed circuit board.

15. The method of manufacturing the solid state drive assembly of claim 11, wherein the solid state drive assembly further comprises:

a static standoff fixedly attached to the first printed circuit board, the static standoff oriented and arranged to rest on the second printed circuit board and to maintain a fixed distance between the first and second printed circuit boards.

* * * * *